US007937834B2

(12) United States Patent
Chang et al.

(10) Patent No.: US 7,937,834 B2
(45) Date of Patent: May 10, 2011

(54) METHOD OF FABRICATING CAPACITIVE ULTRASONIC TRANSDUCERS

(75) Inventors: Ming-Wei Chang, Taichung County (TW); Tsung-Ju Gwo, Banqiao (TW); Tse-Min Deng, Hsinchu (TW); Zhen-Yuan Chung, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 602 days.

(21) Appl. No.: 12/049,224

(22) Filed: Mar. 14, 2008

(65) Prior Publication Data

US 2008/0235936 A1 Oct. 2, 2008

Related U.S. Application Data

(60) Division of application No. 11/427,194, filed on Jun. 28, 2006, now Pat. No. 7,626,891, which is a continuation-in-part of application No. 11/324,408, filed on Jan. 4, 2006, now abandoned.

(30) Foreign Application Priority Data

Oct. 28, 2005 (TW) .............................. 94137938 A

(51) Int. Cl.
*H05K 3/02* (2006.01)

(52) U.S. Cl. ................ 29/847; 29/594; 29/825; 29/831; 438/48; 438/50; 438/53

(58) Field of Classification Search .................... 29/847, 29/25.41, 594, 825, 831, 846; 367/118, 140, 367/163, 170, 174, 181; 438/48, 50, 53
See application file for complete search history.

(56) References Cited

U.S. PATENT DOCUMENTS

| | | | |
|---|---|---|---|
| 1,975,801 | A | 10/1934 | Rieber |
| 4,432,007 | A | 2/1984 | Cady |
| 5,894,452 | A | 4/1999 | Ladabaum et al. |

(Continued)

FOREIGN PATENT DOCUMENTS

| | | | |
|---|---|---|---|
| EP | 1 085 784 | A2 | 3/2001 |
| JP | 2005 027186 | A | 1/2005 |
| WO | WO 2005/077012 | A2 | 8/2005 |

OTHER PUBLICATIONS

Jin et al., "The Microfabrication of Capacitive Ultrasonic Transducers," *Journal of Microelectromechanical Systems*, vol. 7, No. 3, Sep. 1998.

(Continued)

*Primary Examiner* — Thiem Phan
(74) *Attorney, Agent, or Firm* — Alston & Bird LLP

(57) ABSTRACT

A capacitive ultrasonic transducer includes a first electrode, an insulating layer formed on the first electrode, at least one support frame formed on the insulating layer, and a second electrode formed space apart from the first electrode, wherein the first electrode and the second electrode define an effective area of oscillation of the capacitive ultrasonic transducer, and the respective length of the first electrode and the second electrode defining the effective area of oscillation is substantially the same.

15 Claims, 19 Drawing Sheets

U.S. PATENT DOCUMENTS

| | | | | |
|---|---|---|---|---|
| 6,004,832 | A * | 12/1999 | Haller et al. | 438/50 |
| 6,295,247 | B1 | 9/2001 | Khuri-Yakub et al. | |
| 6,328,697 | B1 * | 12/2001 | Fraser | 600/459 |
| 6,632,178 | B1 | 10/2003 | Fraser | |
| 2005/0203397 | A1 | 9/2005 | Degertekin | |
| 2005/0228285 | A1 | 10/2005 | Huang et al. | |
| 2005/0255408 | A1 | 11/2005 | Grube et al. | |
| 2008/0208057 | A1 | 8/2008 | Hoctor et al. | |

OTHER PUBLICATIONS

Ladabaum et al., "Surface Micromachined Capacitive Ultrasonic Transducers," *IEEE Transactions on Ultrasonics, Ferroelectrics and Frequency Control*, vol. 45, No. 3, May 1998.

European Search Report for EP 06 01 3590 mailed Apr. 14, 2010.

* cited by examiner

METHOD OF FABRICATING CAPACITIVE ULTRASONIC TRANSDUCERS

CROSS-REFERENCE TO RELATED APPLICATION

This application is a Divisional application of U.S. patent application Ser. No. 11/427,194, filed Jun. 28, 2006, which is a continuation-in-part of U.S. patent application Ser. No. 11/324,408, filed Jan. 4, 2006, herein incorporated by reference.

BACKGROUND OF THE INVENTION

The present invention relates to an ultrasonic transducer and more particularly, to a capacitive ultrasonic transducer and a method of fabricating the same.

With the advantages of non-invasive evaluation, real-time response and portability, ultrasonic sensing devices have been widely used in medical, military and aerospace industries. For example, echographic systems or ultrasonic imaging systems are capable of obtaining information from surrounding means or from human body, based on the use of elastic waves at ultrasonic frequency. An ultrasonic transducer is often one of the important components in an ultrasonic sensing device. The majority of known ultrasonic transducers are realized by using piezoelectric ceramic. A piezoelectric transducer is generally used to obtain information from solid materials because the acoustic impedance of piezoelectric ceramic is of the same magnitude order as those of the solid materials. However, the piezoelectric transducer may not be ideal for obtaining information from fluids because of the great impedance mismatching between piezoelectric ceramic and fluids, for example, tissues of the human body. The piezoelectric transducer generally operates in a frequency band from 50 KHz (kilohertz) to 200 KHz. Furthermore, the piezoelectric transducer is generally fabricated in high-temperature processes and may not be ideal for integration with electronic circuits. In contrast, capacitive ultrasonic transducers may be manufactured in batch with standard integrated circuit ("IC") processes and therefore are integrable with IC devices. Furthermore, capacitive ultrasonic transducers are capable of operating at a higher frequency band, from 200 KHz to 5 MHz (megahertz), than known piezoelectric transducers. Consequently, capacitive ultrasonic transducers have gradually taken the place of the piezoelectric transducers.

FIG. 1 is a schematic cross-sectional view of a capacitive ultrasonic transducer 10. Referring to FIG. 1, the capacitive ultrasonic transducer 10 includes a first electrode 11, a second electrode 12 formed on a membrane 13, an isolation layer 14 formed on the first electrode, and support sidewalls 15. A cavity 16 is defined by the first electrode 11, the membrane 13 and support sidewalls 15. When suitable AC or DC voltages are applied between the first electrode 11 and the second electrode 12, electrostatic forces cause the membrane 13 to oscillate and generate acoustic waves. The effective oscillating area of the conventional transducer 10 is the area defined by the first electrode 11 and second electrode 12. In this instance, the effective oscillating area is limited by the length of the second electrode 12 because the second electrode 12 is shorter than the first electrode 11. Furthermore, the membrane 13 is generally fabricated in a high-temperature process such as a conventional chemical vapor deposition ("CVD") or low pressure chemical vapor deposition ("LPCVD") process at a temperature ranging from approximately 400 to 800° C.

FIGS. 2A to 2D are cross-sectional diagrams illustrating a conventional method for fabricating a capacitive ultrasonic transducer. Referring to FIG. 2A, a silicon substrate 21 is provided, which is heavily doped with impurities in order to serve as an electrode. Next, a first nitride layer 22 and an amorphous silicon layer 23 are successively formed over the silicon substrate 21. The first nitride layer 22 functions to protect the silicon substrate 21. The amorphous silicon layer 23 is used as a sacrificial layer and will be removed in subsequent processes.

Referring to FIG. 2B, a patterned amorphous silicon layer 23' is formed by patterning and etching the amorphous silicon layer 23, exposing portions of the first nitride layer 22. A second nitride layer 24 is then formed over the patterned sacrificial layer 23', filling the exposed portions.

Referring to FIG. 2C, a patterned second nitride layer 24' with openings 25 is formed by patterning and etching the second nitride layer 24, exposing portions of the patterned amorphous silicon layer 23' through the openings 25. The patterned amorphous silicon layer 23' is then removed by a selective etch.

Referring to FIG. 2D, a silicon oxide layer is deposited through the openings 25 to form plugs 26. Chambers 27 are thereby defined by the plugs 26, the patterned second nitride layer 24' and the first nitride layer 22. A metal layer 28 is then formed over the patterned second nitride layer 24' to serve as a second electrode.

In addition, conventional capacitive ultrasonic transducers usually include a silicon-based substrate. Conventional methods for fabricating such conductive ultrasonic transducers may use bulk micromachining or surface micromachining in a high-temperature process, adversely resulting in high residual stress, which may cause the deformation of the membrane of the capacitive ultrasonic transducer. To alleviate the residual stress, additional processes such as annealing may be required, which means a longer processing time and a higher manufacturing cost.

Furthermore, the chamber, or cavity, in a conventional capacitive ultrasonic transducer is generally formed by elements of different materials having different thermal coefficients, which may affect the performance of the transducer. Moreover, the membrane of a conventional capacitive ultrasonic transducer may be damaged when the transducer is assembled with a protection housing during package. It is desirable to have an improved capacitive ultrasonic transducer and a method of fabricating the same.

BRIEF SUMMARY OF THE INVENTION

The present invention is directed to a capacitive ultrasonic transducer and a method for fabricating the same that obviate one or more problems resulting from the limitations and disadvantages of the prior art.

In accordance with an example of the present invention, there is provided a capacitive ultrasonic transducer that comprises a conductive substrate, an insulating layer formed on the conductive substrate, a support frame formed on the insulating layer, and a conductive layer spaced apart from the conductive substrate by the support frame having substantially the same thermal coefficient as the support frame.

In one aspect, the support frame and the conductive layer are made of substantially the same material.

In another aspect, the support frame and the conductive layer include a material selected from one of nickel (Ni), nickel-cobalt (NiCo), nickel-ferrite (NiFe) and nickel-manganese (NiMn).

Also in accordance with the present invention, there is provided a capacitive ultrasonic transducer that includes a first electrode, an insulating layer formed on the first electrode, at least one support frame formed on the insulating layer, and a second electrode formed spaced apart from the first electrode, wherein the first electrode and the second electrode define an effective area of oscillation of the capacitive ultrasonic transducer, and the respective length of the first electrode and the second electrode defining the effective area of oscillation is substantially the same.

Still in accordance with the present invention, there is provided a capacitive ultrasonic transducer that comprises a substrate, a support frame formed over the substrate, and a conductive layer held by the support frame over the substrate so that a chamber is defined by the conductive layer, the support frame and the substrate.

Further in accordance with the present invention, there is provided a method for fabricating capacitive ultrasonic transducers that comprises providing a substrate, forming an insulating layer on the substrate, forming a patterned first metal layer on the insulating layer, forming a patterned second metal layer substantially coplanar with the patterned first metal layer, forming a patterned third metal layer on the patterned first metal layer and the patterned second metal layer, exposing portions of the patterned first metal layer through openings, and removing the patterned first metal layer through the openings.

Also in accordance with the present invention, there is provided method for fabricating capacitive ultrasonic transducers that comprises providing a substrate, forming an insulating layer on the substrate, forming a patterned first metal layer on the insulating layer, forming a second metal layer on the patterned first metal layer, patterning the second metal layer to expose portions of the patterned first metal layer through openings, and removing the patterned first metal layer through the openings.

Still in accordance with the present invention, there is provided a method for fabricating capacitive ultrasonic transducers that comprises providing a substrate, forming an insulating layer on the substrate, forming a metal layer on the insulating layer, forming a patterned photoresist layer on the metal layer, exposing portions of the metal layer, forming a patterned first metal layer substantially coplanar with the patterned photoresist layer, removing the patterned photoresist layer, forming a patterned second metal layer substantially coplanar with the patterned first metal layer, forming a patterned third metal layer on the patterned first metal layer and the patterned second metal layer, exposing portions of the patterned first metal layer through openings, and removing the patterned first metal layer and portions of the metal layer through the openings.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

In the drawings:

FIGS. 4D-1 and 4E-1 are schematic cross-sectional diagrams illustrating a method for fabricating capacitive ultrasonic transducers in accordance with one example of the invention;

FIGS. 5D-1 and 5E-1 are schematic cross-sectional diagrams illustrating a method for fabricating capacitive ultrasonic transducers in accordance with one example of the invention;

DETAILED DESCRIPTION OF THE INVENTION

Reference will now be made in detail to the present examples of the invention, examples of which are illustrated in the accompanying drawings. Wherever possible, the same reference numbers will be used throughout the drawings to refer to the same or like parts.

Figure 3A:
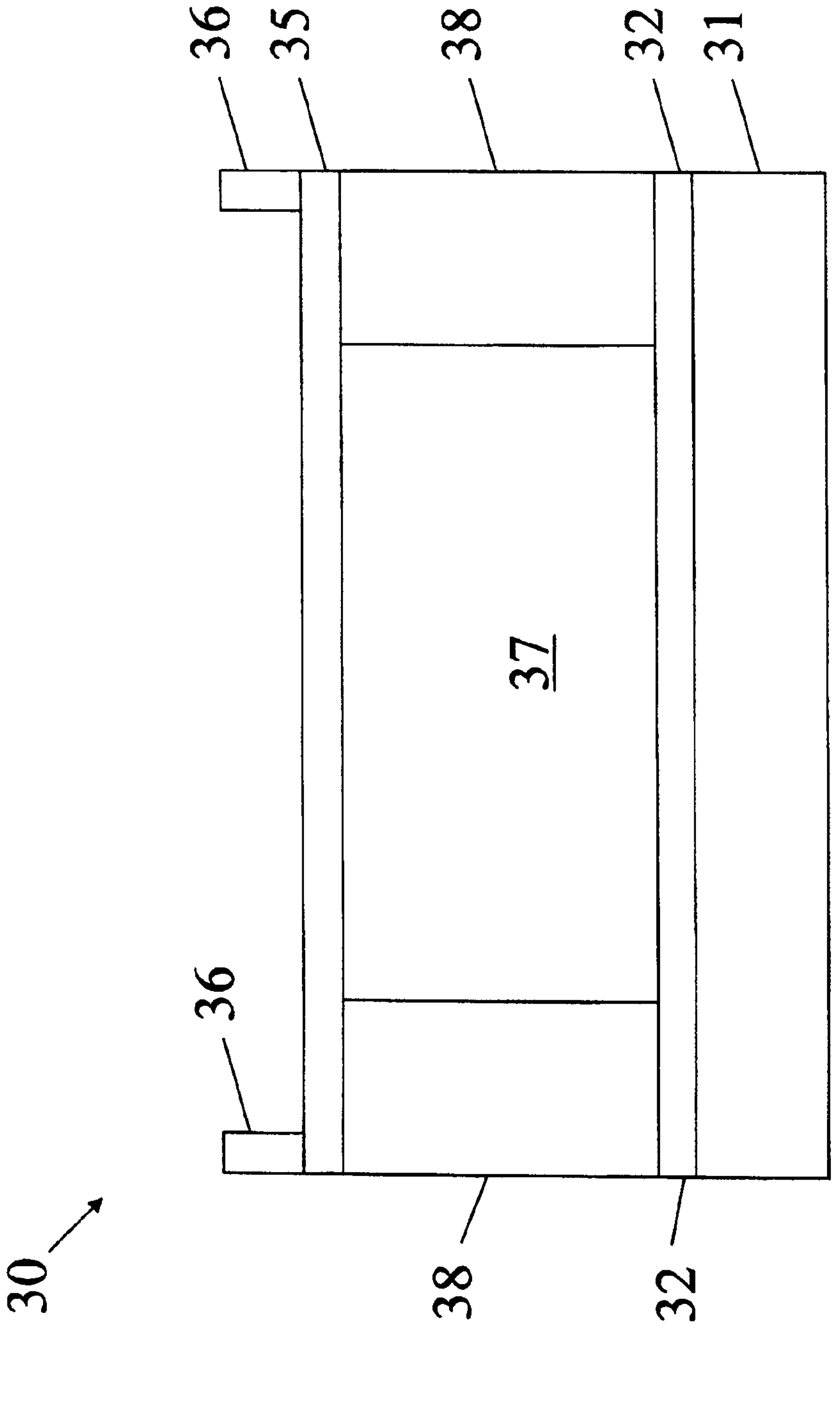
FIG. 3A is a schematic cross-sectional view of a capacitive ultrasonic transducer in accordance with one example of the present invention.

FIG. 3A is schematic cross-sectional view of a capacitive ultrasonic transducer 30 in accordance with one example of the present invention. Referring to FIG. 3A, the capacitive ultrasonic transducer 30 includes a substrate 31, an insulating layer 32, a support frame 38 and a conductive layer 35. In one example, the substrate 31 may have a thickness of approximately 525 μm, formed by a silicon wafer densely doped with phosphor to a resistivity level of approximately 0.1 to 0.4 micro ohm per square centimeter ($\mu\Omega/cm^2$). In another aspect, the substrate 31 is a metal substrate made of aluminum (Al) or copper (Cu). The substrate 31 serves as a lower or a first electrode of the capacitive ultrasonic transducer 30. The insulating layer 32 includes a material selected from one of oxide, nitride, or oxynitride. In one example according to the present invention, the insulating layer 32 includes silicon dioxide ($SiO_2$) having a thickness of approximately 0.2 micrometer (μm). The support frame 38 includes the material selected from one of nickel (Ni), nickel-cobalt (NiCo), nickel-ferrite (NiFe) and nickel-manganese (NiMn). In one example, the support frame 38 includes a nickel layer having a thickness of approximately 0.5 to 10 μm. The conductive layer 35, spaced apart from the substrate 31 by the insulating layer 32 and the support frame 38, serves as an oscillating membrane and also an upper or a second electrode of the capacitive ultrasonic transducer 30. The conductive layer 35 includes a material selected from one of Ni, NiCo, NiFe and NiMn. In one example, the conductive layer 35 includes a nickel layer having a thickness ranging from approximately 0.5 to 5 μm.

A chamber 37, either sealed or unsealed, is defined by the insulating layer 32, the support frame 38 and the conductive layer 35. Accordingly, the effective oscillating area of the transducer 30 is defined by the substrate 31 and the conductive layer 35. Because respective length of the substrate 31 and conductive layer 35 defining the chamber 37 is substantially the same, spanning the entire length of the chamber 37, the effective oscillating of the transducer 30 represents an increase over the conventional capacitive transducer illustrated in FIG. 1, and therefore, an increase in performance of the transducer 30 over conventional capacitive transducers.

Referring again to FIG. 3A, the capacitive ultrasonic transducer 30 may further include at least one bump 36 formed on the conductive layer 35 and disposed above the support frame 38. The bump 36 functions to protect the conductive layer 35 from damage or incidental oscillation. The bump 36 may be formed with a material selected from one of Ni, NiCo, NiFe and NiMn. In one example, the bump 36 includes a nickel layer having a thickness of approximately 5 to 50 μm. In another example, the support frame 38 and the conductive layer 35 are made of substantially the same material, which alleviates the issue of different thermal coefficients that would be likely to occur in the conventional capacitive transducers.

Figure 3B:
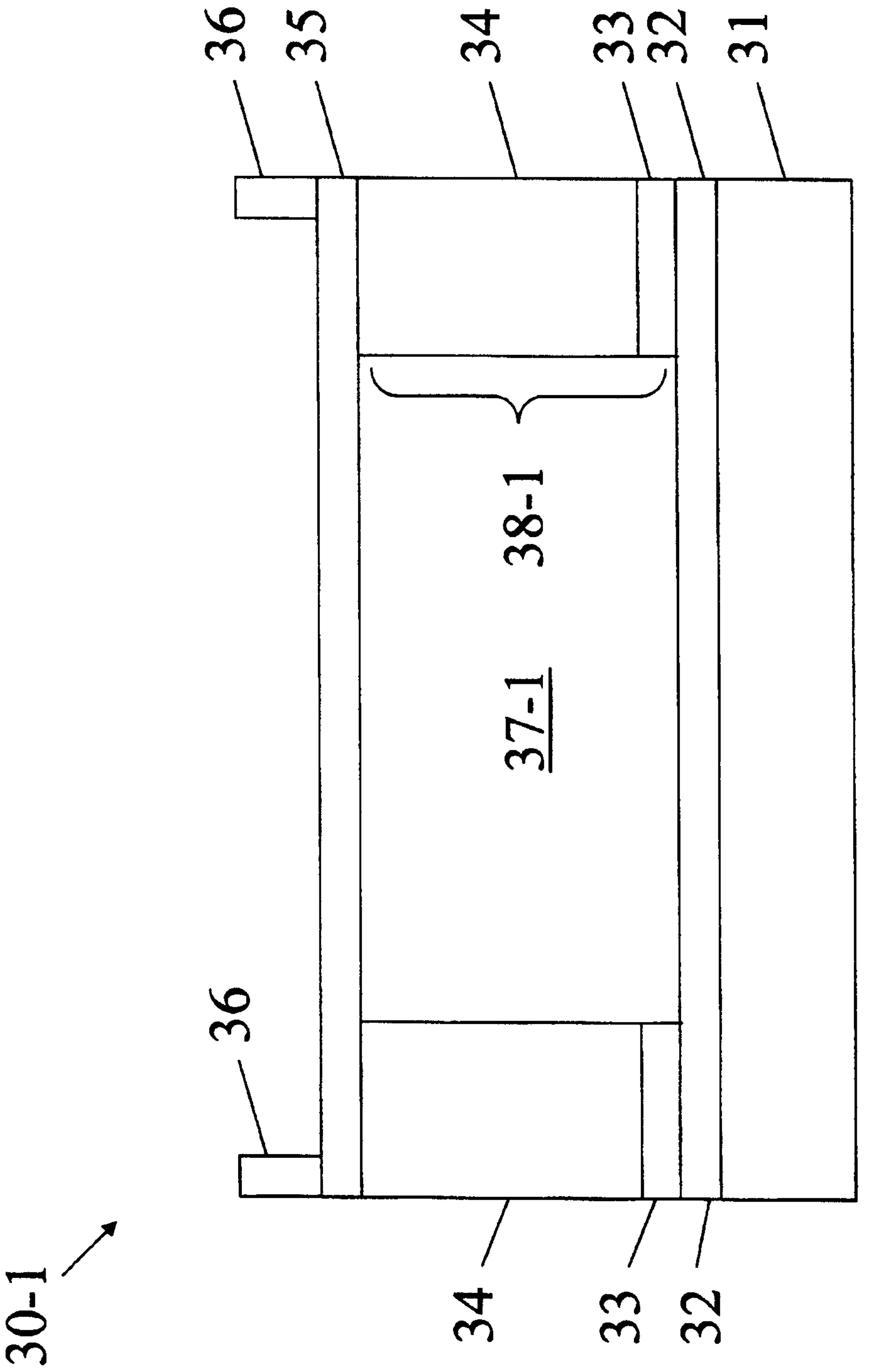
FIG. 3B is a schematic cross-sectional view of a capacitive ultrasonic transducer in accordance with another example of the present invention.

FIG. 3B is a schematic cross-sectional view of a capacitive ultrasonic transducer 30-1 in accordance with another example of the present invention. Referring to FIG. 3B, the capacitive ultrasonic transducer 30-1 includes a similar structure to the capacitive ultrasonic transducer 30 illustrated in FIG. 3A except that a support frame 38-1 includes a seed layer 33. The seed layer 33 is formed on the insulating layer 32 to facilitate metallic interconnect in, for example, an electrochemical deposition process or an electrochemical plating process. The seed layer 33 includes a material selected from one of titanium (Ti), copper (Cu), Ni, NiCo, NiFe and NiMn. In one example, the seed layer 33 includes a nickel layer having a thickness of approximately 0.15 to 0.3 μm. A chamber 37-1, either sealed or unsealed, is defined by the insulating layer 32, the support frame 38-1 and the conductive layer 35.

Figure 4A:
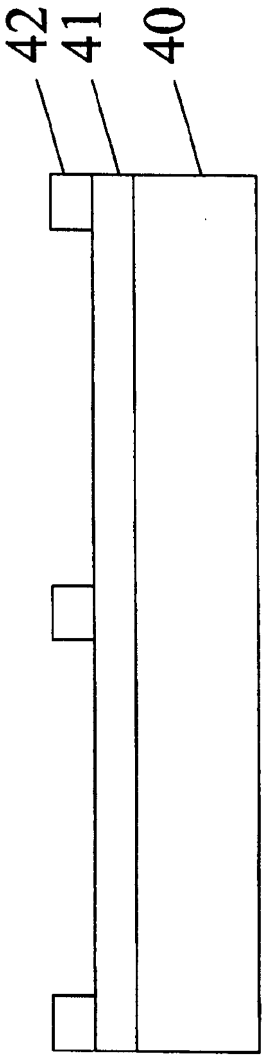
FIGS. 4A to 4G are schematic cross-sectional diagrams illustrating a method for fabricating capacitive ultrasonic transducers in accordance with one example of the invention.

FIGS. 4A to 4G are schematic cross-sectional diagrams illustrating a method for fabricating a capacitive ultrasonic transducer in accordance with one example of the invention. Referring to FIG. 4A, a substrate 40 is provided, which serves as a first electrode common to the capacitive ultrasonic transducers being fabricated. The substrate 40 includes one a doped silicon substrate and a metal substrate. An insulating layer 41, which functions to protect the substrate 40, is formed on the substrate 40 by a chemical vapor deposition ("CVD") process or other suitable processes. The insulating layer 41 includes oxide, nitride, or oxynitride. Next, a patterned photoresist layer 42, for example, PMMA (polymethylmethacry) or SU-8, is formed on the insulating layer 41, exposing portions of the insulating layer 41.

Figure 4B:
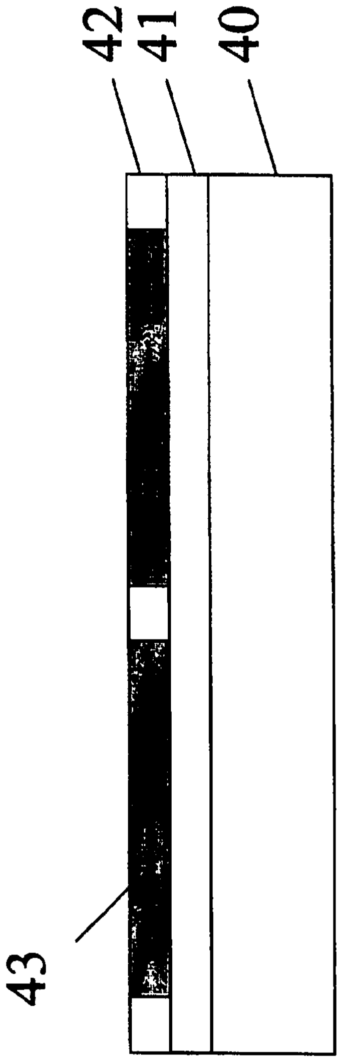

Referring to FIG. 4B, a sacrificial metal layer 43 is formed on the patterned photoresist layer 42 by, for example, a sputtering, evaporating or plasma-enhanced CVD ("PECVD") process followed by a lapping or chemical-mechanical polishing ("CMP") process or other suitable processes. The sacrificial metal layer 43 is substantially coplanar with the patterned photoresist layer 42, and will be removed in a subsequent process. In one example according to the present invention, the sacrificial metal layer 43 includes copper (Cu).

Figure 4C:
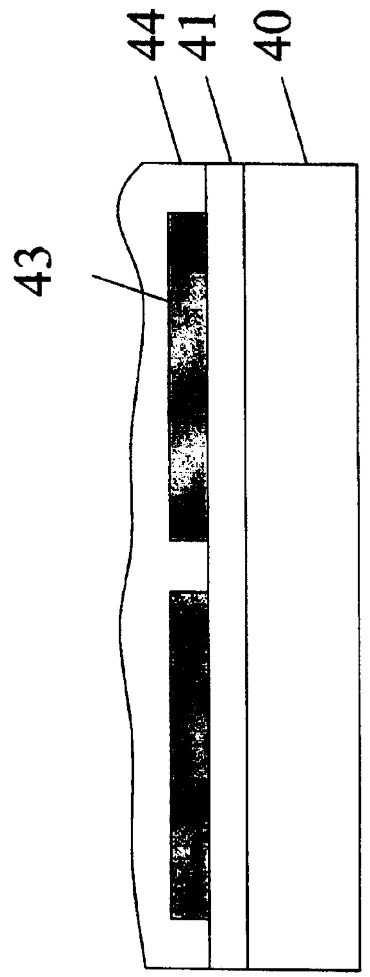

Referring to FIG. 4C, the patterned photoresist layer 42 is stripped and a metal layer 44 is formed on the sacrificial metal layer 43.

Figure 4D:
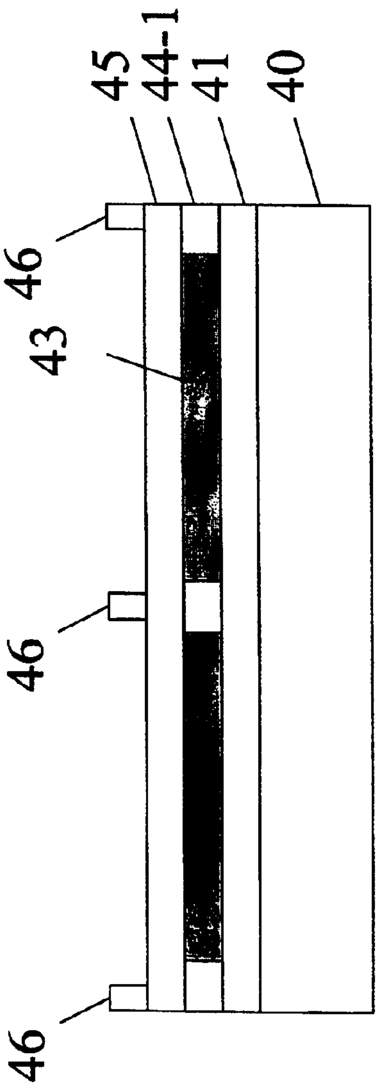
Figures 1, 4D:
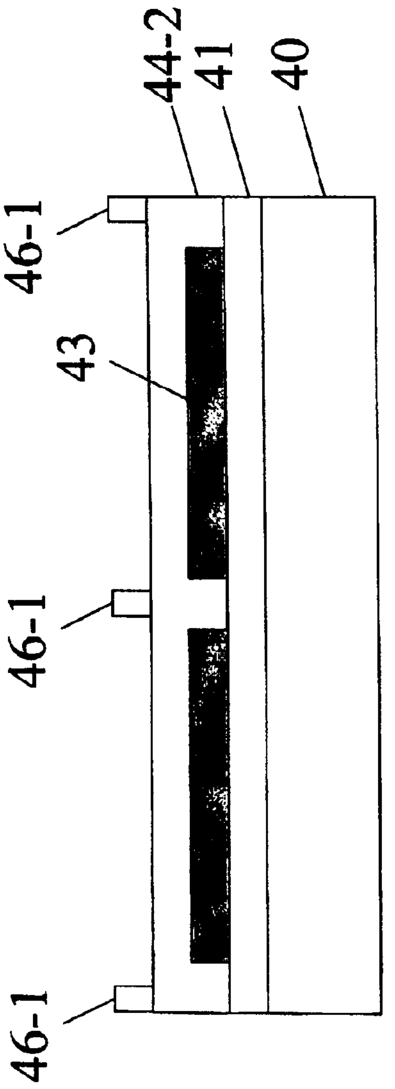

Referring to FIG. 4D, the metal layer 44 illustrated in FIG. 4C is lapped or polished by a lapping or CMP process so that a patterned metal layer 44-1 substantially coplanar with the sacrificial metal layer 43 is obtained. The patterned metal layer 44-1 subsequently becomes a support frame for the capacitive ultrasonic transducer. Next, a conductive layer 45 is formed on the patterned metal layer 44-1 and the sacrificial metal layer 43 by a sputtering, evaporating or PECVD process. In one example, the patterned metal layer 44-1 and the conductive layer 45 are formed with substantially the same material, selected from one of Ni, NiCo, NiFe and NiMn. Next, bumps 46 are formed by forming a layer of metal by a sputtering, evaporating or PECVD process followed by a patterning and etching process. In one example, the bump 46 includes the material selected from one of Ni, NiCo, NiFe and NiMn.

Figures 1, 4E:
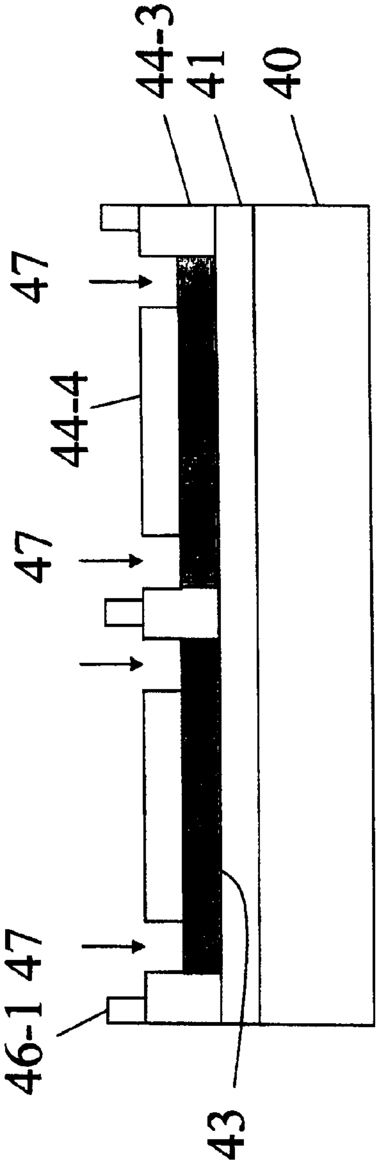
Figure 4E:
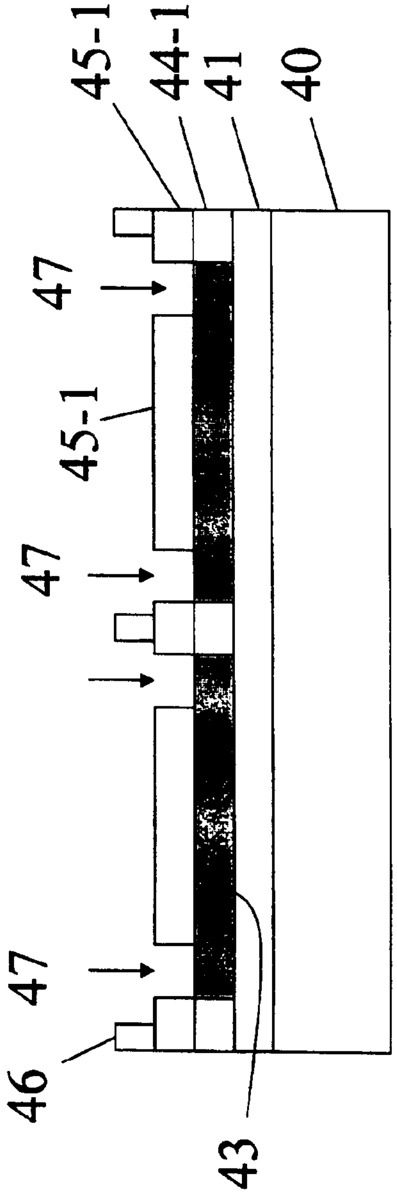

Referring to FIG. 4E, a patterned conductive layer 45-1 is formed by, for example, patterning and etching the conductive layer 45 illustrated in FIG. 4D, exposing portions of the sacrificial metal layer 43 through openings 47. The patterned conductive layer 45-1 sequentially becomes an oscillating membrane and also a second electrode for a capacitive ultrasonic transducer.

Figure 4F:
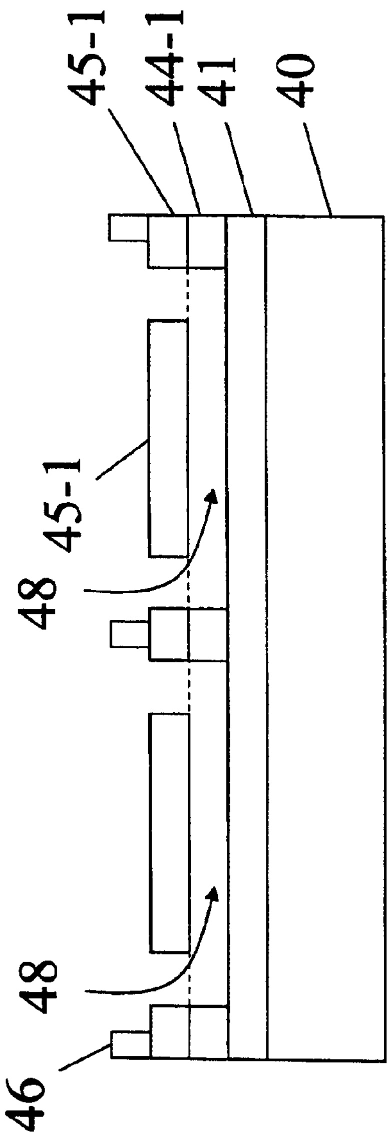

Referring to FIG. 4F, the sacrificial metal layer 43 illustrated in FIG. 4E is removed through an etching process. In one example, the sacrificial metal layer 43 is removed by a wet etching process using ferric chloride ($FeCl_3$) as an etchant solution, which is etch selective so that the sacrificial metal layer 43 is removed without significantly removing the insulating layer 41. Chambers 48 are therefore defined, but not sealed, by the patterned conductive layer 45-1, patterned metal layer 44-1 and insulating layer 41.

Figure 4G:
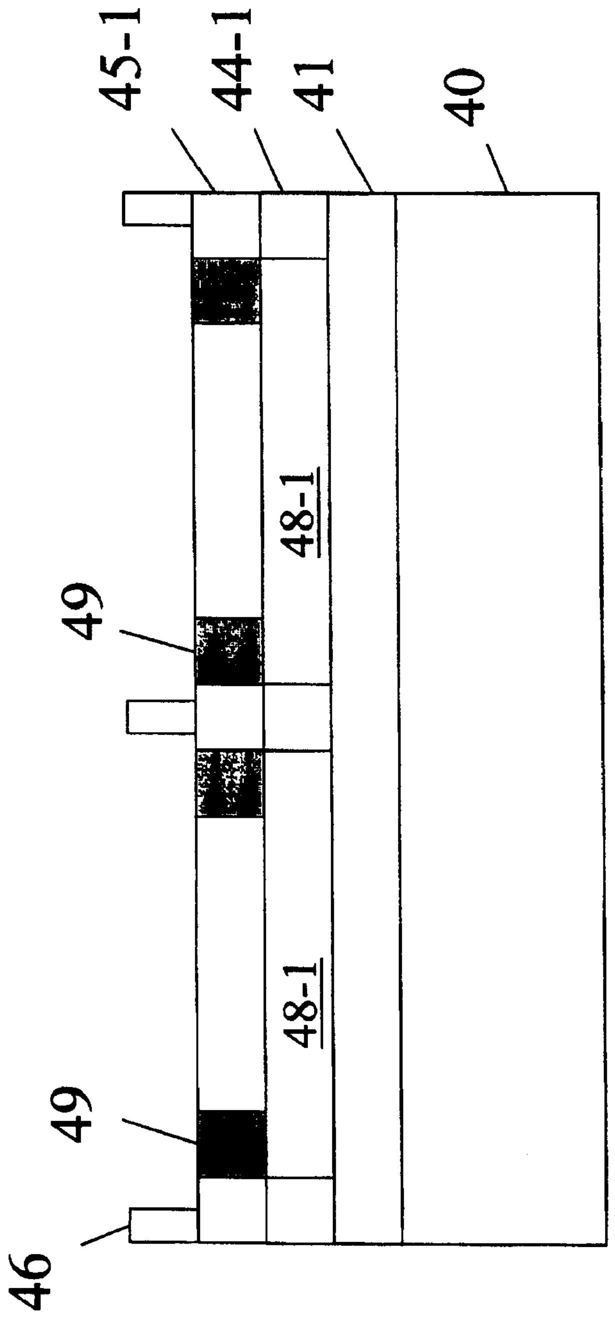

Referring to FIG. 4G, another patterned metal layer 49 may be formed to fill the openings 47 illustrated in FIG. 4E by, for example, a sputtering, evaporating, PECVD or other suitable processes having a desirable step coverage. Chambers 48-1 are therefore defined and sealed by the patterned conductive layer 45-1, patterned metal layer 44-1, insulating layer 41 and patterned metal layer 49.

Figure 1:
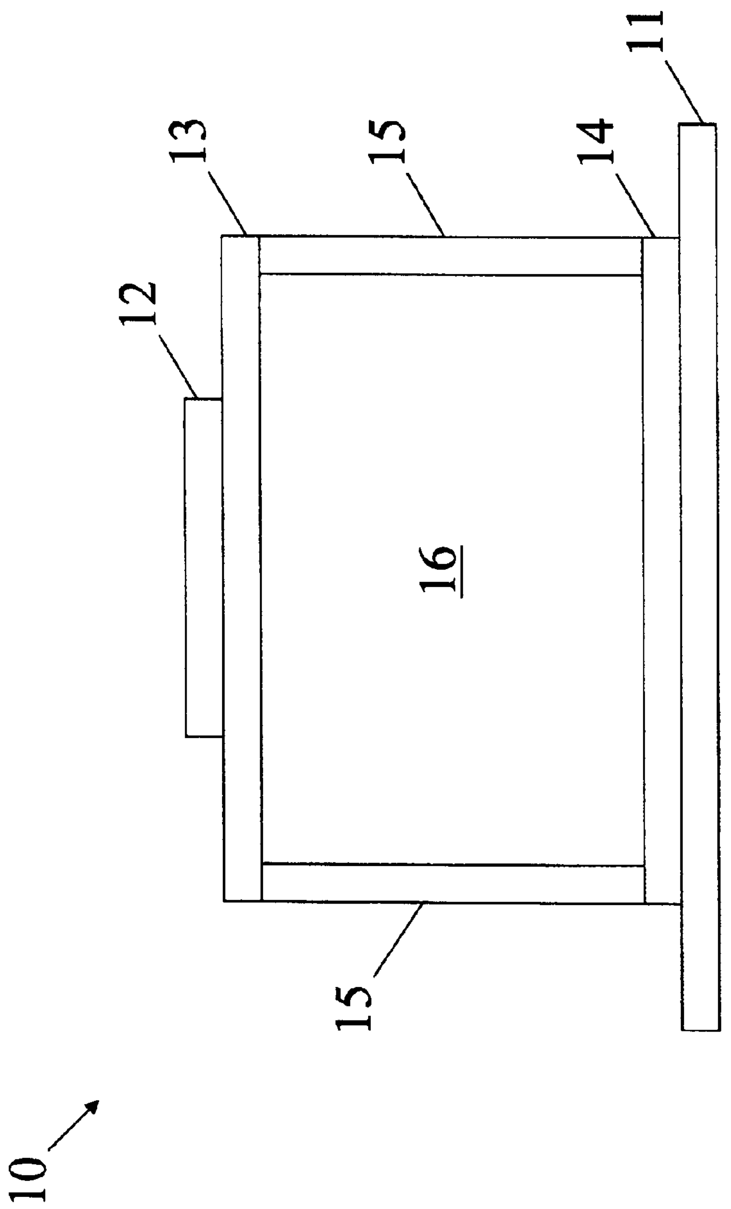
FIG. 1 (PRIOR ART)
FIG. 1 is a schematic cross-sectional view of a conventional capacitive ultrasonic transducer.
Figure 2A:
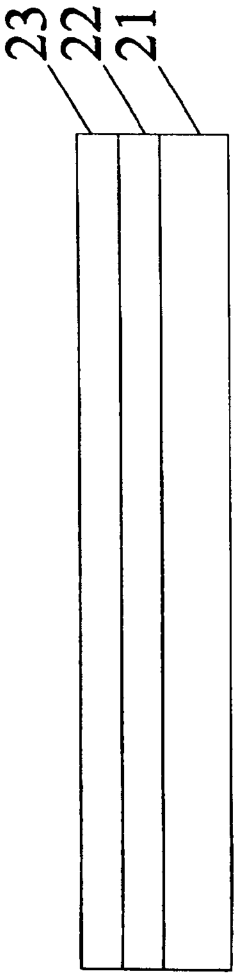
FIG. 2A (PRIOR ART)
FIGS. 2A to 2D are cross-sectional diagrams illustrating a conventional method for fabricating a capacitive ultrasonic transducer.
Figure 2B:
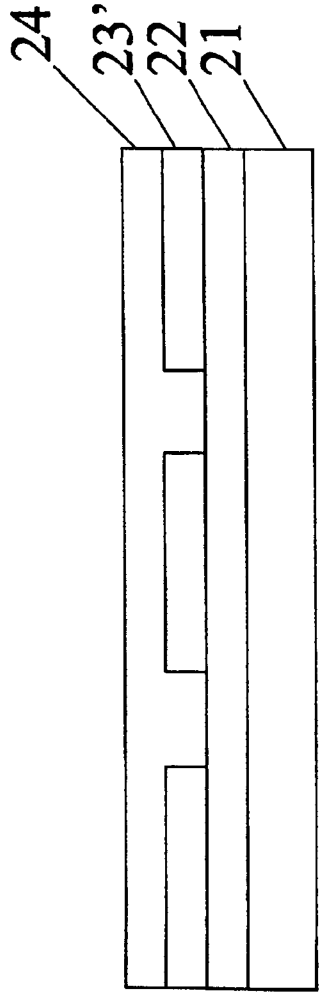
FIG. 2B (PRIOR ART)
Figure 2C:
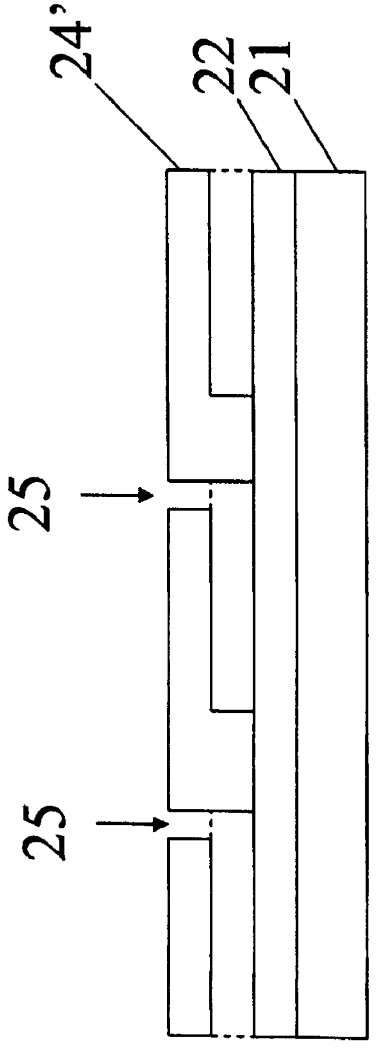
FIG. 2C (PRIOR ART)
Figure 2D:
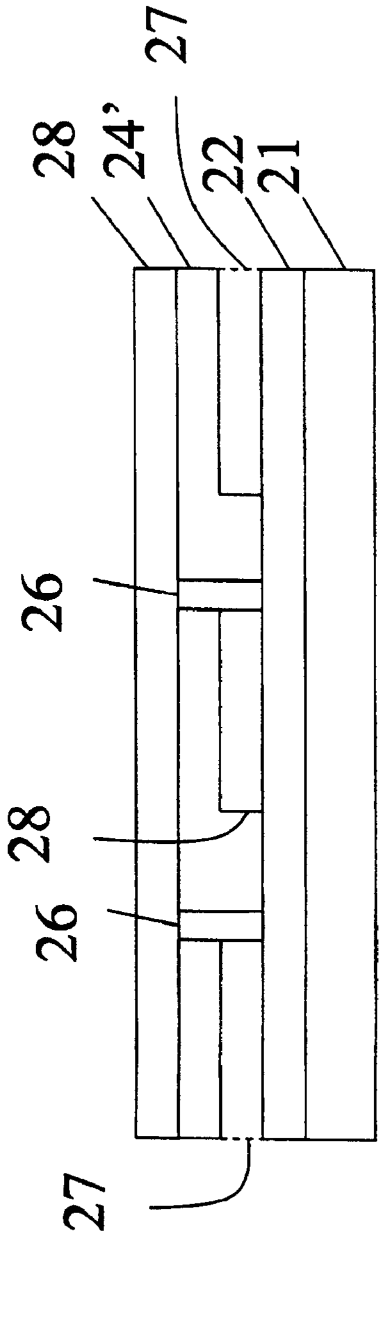
FIG. 2D (PRIOR ART)

FIGS. 4D-1 and 4E-1 are schematic cross-sectional diagrams illustrating a method for fabricating capacitive ultrasonic transducers in accordance with one example of the invention. Referring to FIG. 4D-1, also referring to FIG. 4D as a comparison, after forming the metal layer 44 on the sacrificial metal layer 43, the metal layer 44 is not reduced to substantially the same thickness as the sacrificial layer 43 by the lapping or polishing process. Instead, a patterned metal layer 44-2 is formed to cover the sacrificial metal layer 43. Next, bumps 46-1 are formed on the patterned metal layer 44-2.

Referring to FIG. 4E-1, also referring to FIG. 4E as a comparison, a patterned metal layer (not numbered) including first portions 44-3 and second portions 44-4 is formed by, for example, patterning and etching the patterned metal layer 44-2 illustrated in FIG. 4D-1, exposing portions of the sacrificial metal layer 43 through openings 47. The first portions 44-3 and the second portions 44-4 of the patterned metal layer subsequently become a support frame and an oscillating membrane, respectively, for a capacitive ultrasonic transducer.

Figure 5A:
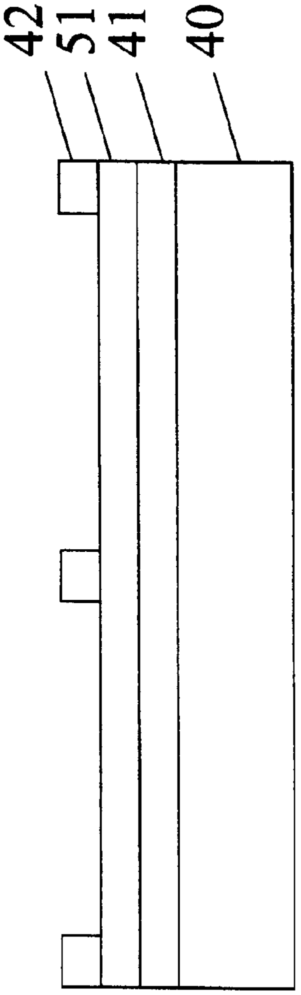
FIGS. 5A to 5G are schematic cross-sectional diagrams illustrating a method for fabricating capacitive ultrasonic transducers in accordance with another example of the invention.

FIGS. 5A to 5G are schematic cross-sectional diagrams illustrating a method for fabricating capacitive ultrasonic transducers in accordance with another example of the invention. The method illustrated through FIGS. 5A to 5D is similar to that illustrated through FIG. 4A to 4G except the formation of an additional a seed layer 51. Referring to FIG. 5A, the substrate 40 is provided and the insulating layer 41 is formed on the substrate 40. The seed layer 51 is then formed on the insulating layer 41 by a sputtering, evaporating or PECVD process. In one example according to the present invention, the seed layer 51 includes a material selected from one of Ti, Cu, Ni, NiCo, NiFe and NiMn. Next, the patterned photoresist layer 42 is formed on the seed layer 51, exposing portions of the seed layer 51.

Figure 5B:
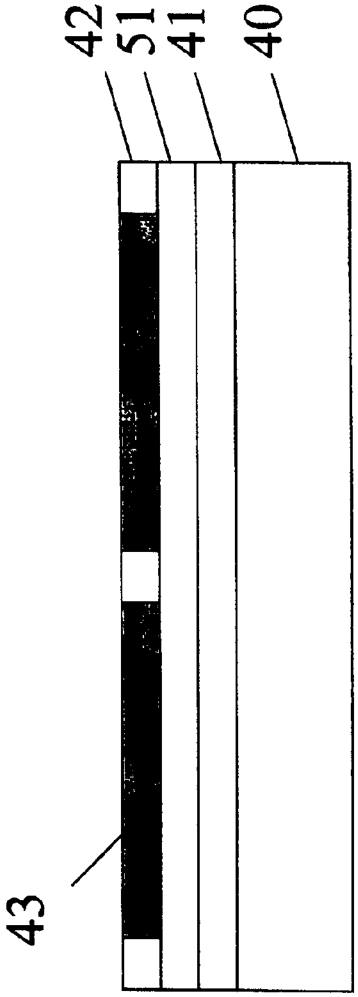

Referring to FIG. 5B, a sacrificial metal layer 43 is formed on the patterned photoresist layer 42 by, for example, an electrochemical deposition process, an electrochemical plating process, or other suitable processes followed by a lapping or CMP process.

Figure 5C:
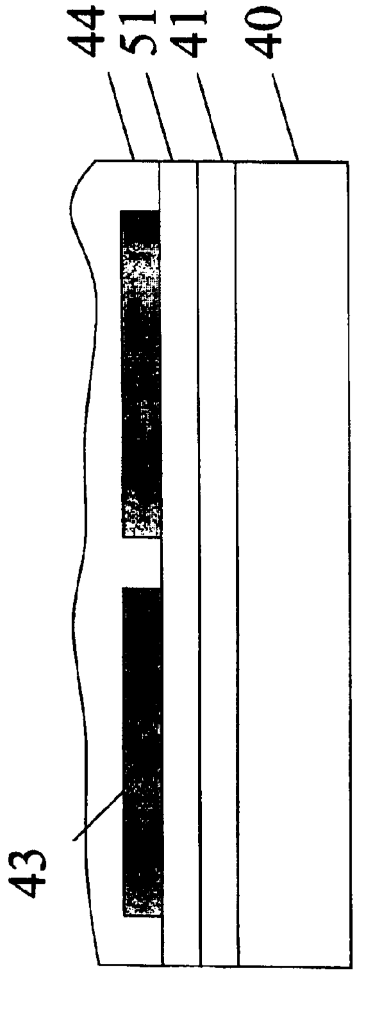

Referring to FIG. 5C, the patterned photoresist layer 42 is stripped and the metal layer 44 is formed on the sacrificial metal layer 43 by, for example, an electrochemical deposition process, an electrochemical plating process, or other suitable processes.

Figure 5D:
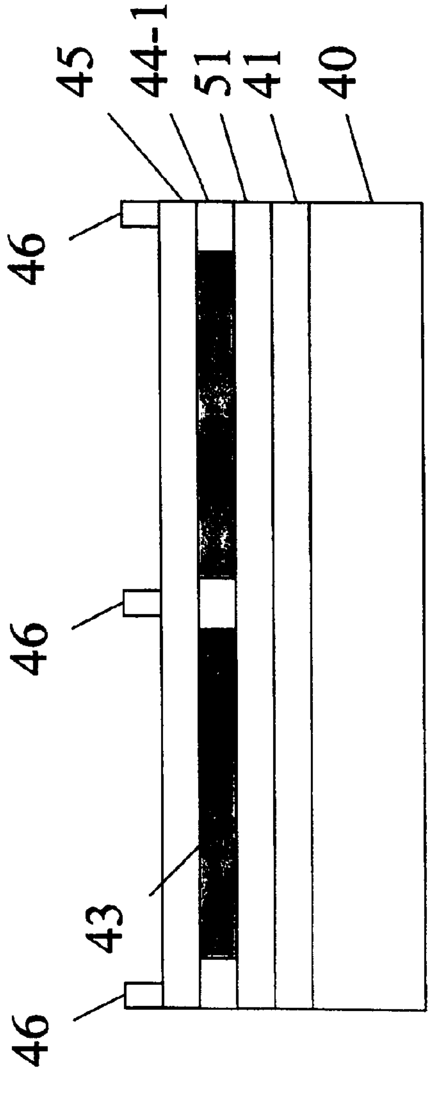
Figures 1, 5D:
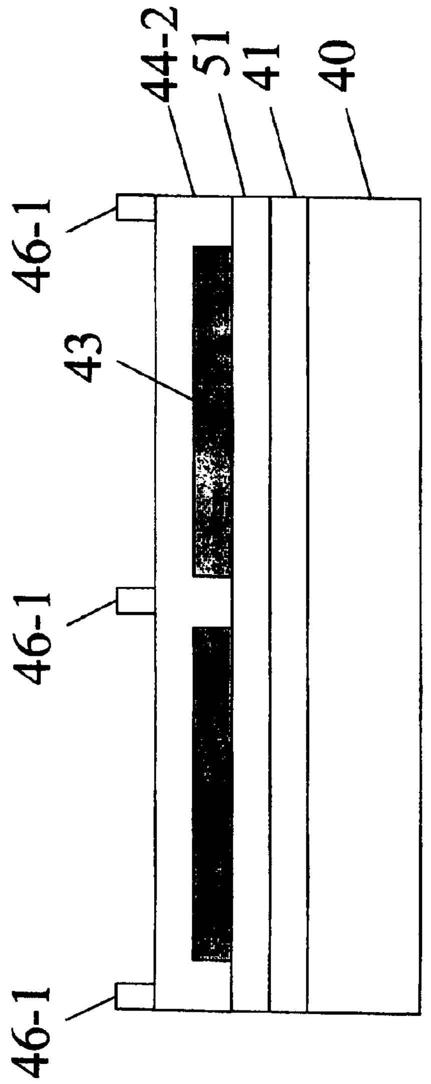

Referring to FIG. 5D, the metal layer 44 illustrated in FIG. 5C is lapped or polished by a lapping or CMP process so that the patterned metal layer 44-1 substantially coplanar with the sacrificial metal layer 43 is obtained. Next, the conductive layer 45 is formed on the patterned metal layer 44-1 and the sacrificial metal layer 43 by an electrochemical deposition process, an electrochemical plating process, or other suitable processes. In one example, the seed layer 51, the patterned metal layer 44-1 and the conductive layer 45 include substantially the same material, which is selected from one of Ni, NiCo, NiFe and NiMn. Next, bumps 46 disposed above the patterned metal layer 44-1 are formed by forming a layer of metal by a sputtering, evaporating or PECVD process followed by patterning and etching processes.

Figures 1, 5E:
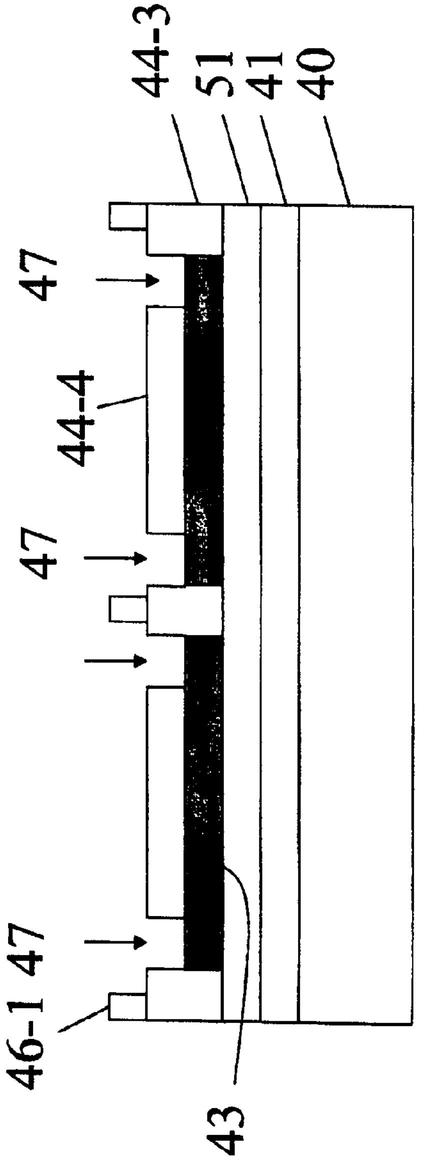
Figure 5E:
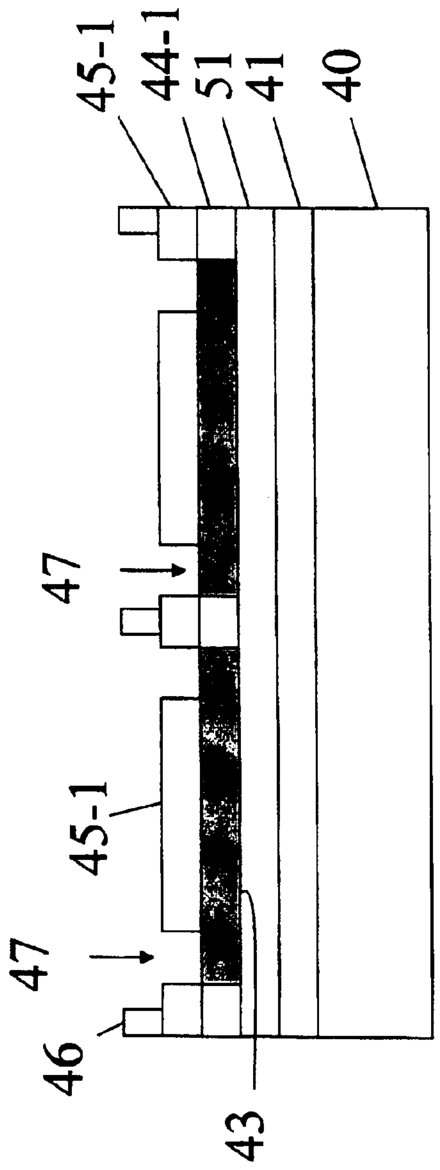

Referring to FIG. 5E, the patterned conductive layer 45-1 is formed by, for example, patterning and etching the conductive layer 45 illustrated in FIG. 5D, exposing portions of the sacrificial metal layer 43 through openings 47. The patterned conductive layer 45-1 subsequently becomes an oscillating membrane and also a second electrode for a capacitive ultrasonic transducer.

Figure 5F:
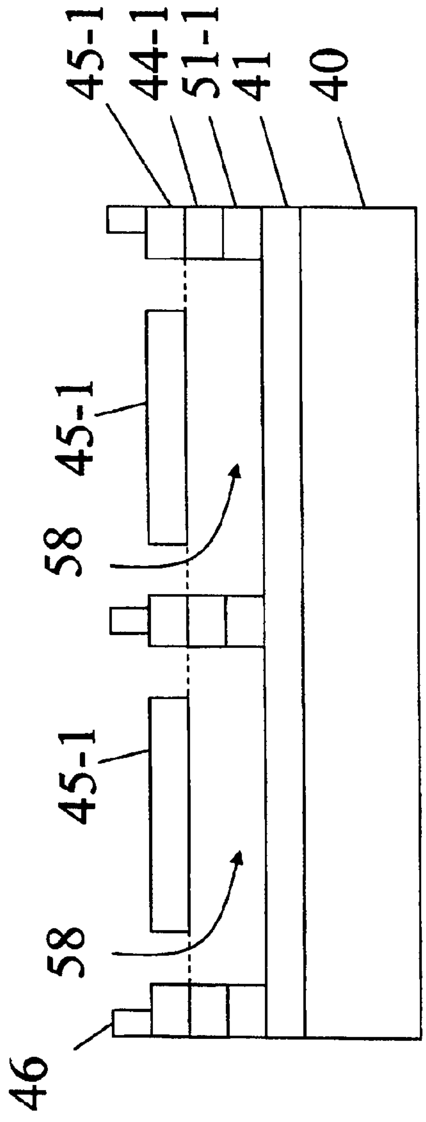

Referring to FIG. 5F, the sacrificial metal layer 43 and portions of the seed layer 51 illustrated in FIG. 5E are removed by an etching process. In one example, the sacrificial metal layer 43 and the portions of the seed layer 51 are removed by a wet etching process using ferric chloride ($FeCl_3$) as an etchant solution, which is etch selective. The patterned metal layer 44-1 and a patterned seed layer 51-1 subsequently together become a support frame for a capacitive ultrasonic transducer. Chambers 58 are therefore defined but not sealed by the patterned conductive layer 45-1, the patterned metal layer 44-1, the patterned seed layer 51-1 and the insulating layer 41.

Figure 5G:
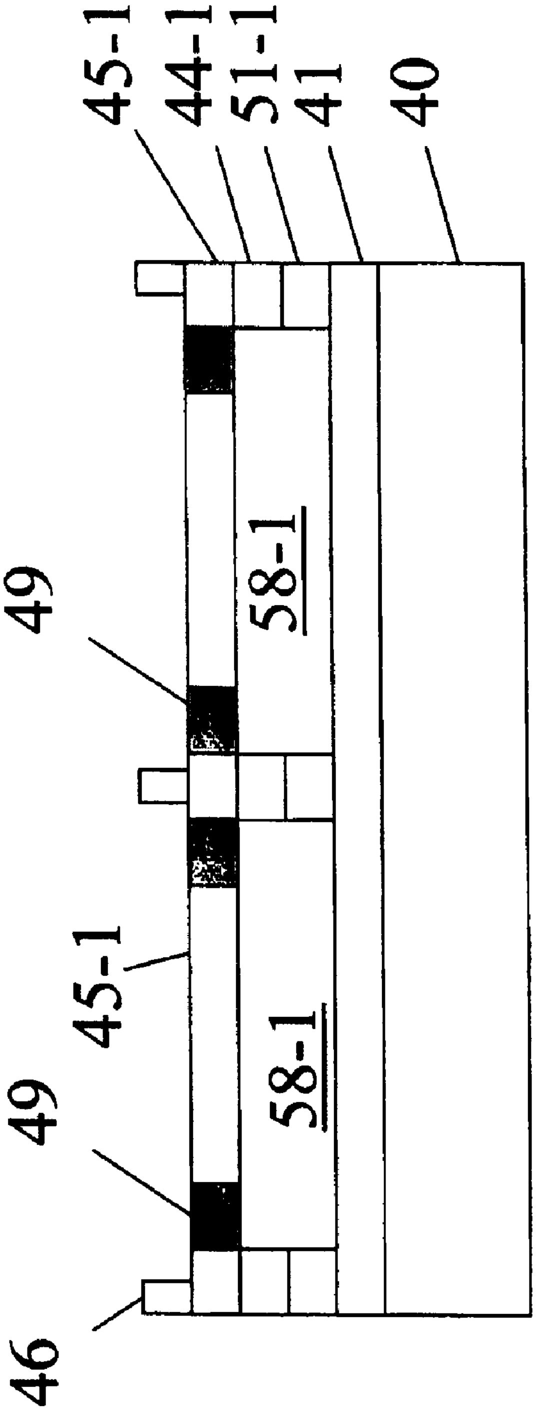

Referring to FIG. 5G, another patterned metal layer 49 may be formed to fill the openings 47 illustrated in FIG. 5E by, for example, an electrochemical deposition process, an electrochemical plating process or other suitable processes having a desirable step coverage. Chambers 58-1 are therefore defined and sealed by the patterned conductive layer 45-1, the patterned metal layer 44-1, the patterned seed layer 51-1, the insulating layer 41 and the another patterned metal layer 49.

FIGS. 5D-1 and 5E-1 are schematic cross-sectional diagrams illustrating a method for fabricating capacitive ultrasonic transducers in accordance with one example of the invention. Referring to FIG. 5D-1, also referring to FIG. 5D as a comparison, after forming the sacrificial layer 43 on the seed layer 51 and forming the metal layer 44 on the sacrificial metal layer 43, the metal layer 44 is not reduced to substantially the same thickness as the sacrificial layer 43 by the lapping or polishing process. Instead, a patterned metal layer 44-2 is formed to cover the sacrificial metal layer 43. Next, bumps 46-1 are formed on the patterned metal layer 44-2.

Referring to FIG. 5E-1, also referring to FIG. 5E as a comparison, a patterned metal layer (not numbered) including first portions 44-3 and second portions 44-4 is formed by, for example, patterning and etching the patterned metal layer 44-2 illustrated in FIG. 5D-1, exposing portions of the sacrificial metal layer 43 through openings 47. The first portions 44-3 and the second portions 44-4 of the patterned metal layer subsequently become a support frame and an oscillating membrane, respectively, for a capacitive ultrasonic transducer.

Figure 6A:
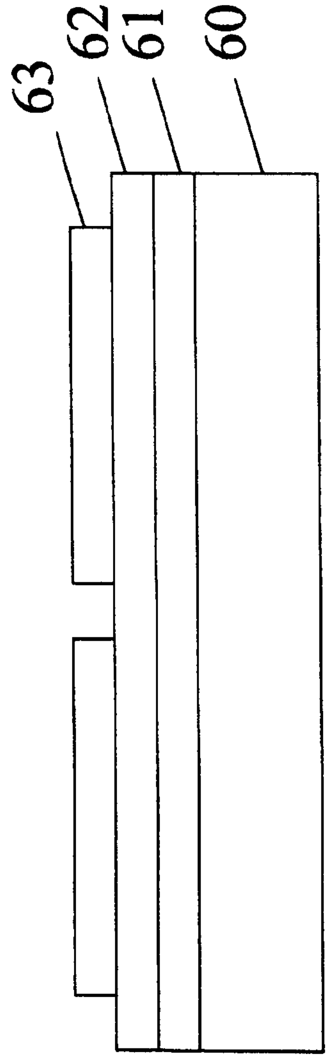
FIGS. 6A to 6D are schematic cross-sectional diagrams illustrating a method for fabricating capacitive ultrasonic transducers in accordance with yet another example of the present invention.

FIGS. 6A to 6D are schematic cross-sectional diagrams illustrating a method for fabricating capacitive ultrasonic transducers in accordance with yet another example of the present invention. Referring to FIG. 6A, a substrate 60 is provided and an insulating layer 61 is formed on the substrate 60. A seed layer 62 is then formed on the insulating layer 61 by a sputtering, evaporating or PECVD process. Next, a patterned photoresist layer 63 is formed on the seed layer 62, exposing portions of the seed layer 62. The patterned photoresist layer 63 defines chamber sites for the capacitive ultrasonic transducers being fabricated.

Figure 6B:
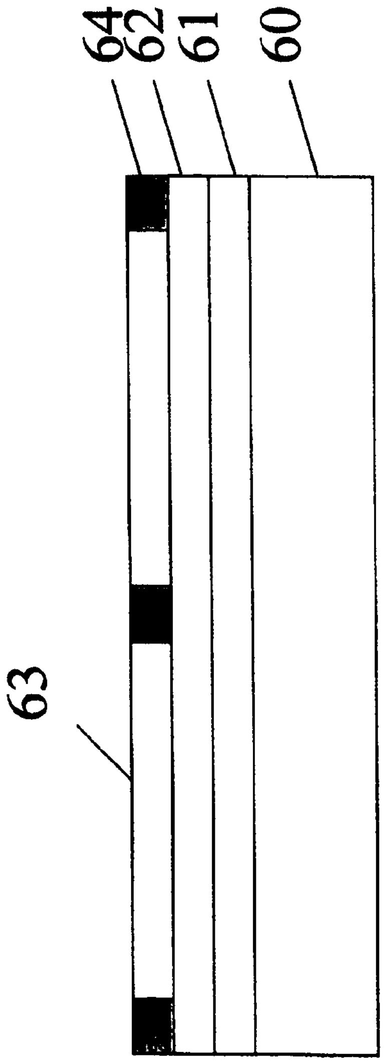

Referring to FIG. 6B, a patterned metal layer 64 is formed on the patterned photoresist layer 63 by, for example, an electrochemical deposition process, an electrochemical plating process or other suitable processes followed by a lapping or CMP process.

Figure 6C:
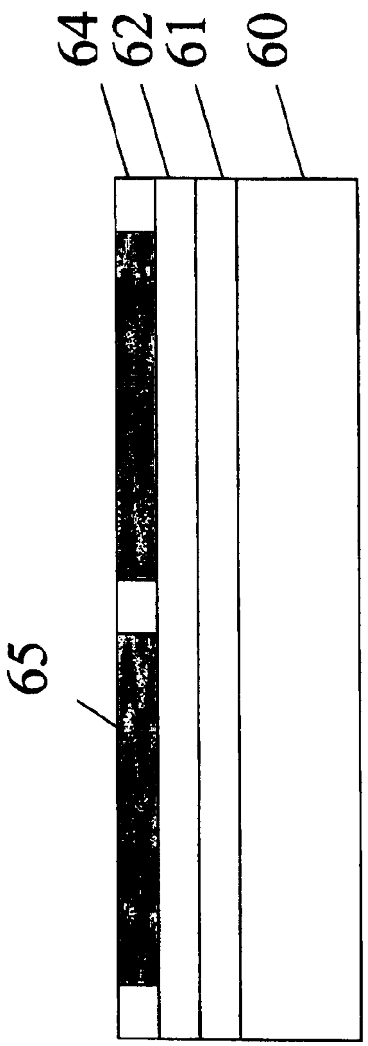

Referring to FIG. 6C, the patterned photoresist layer 63 is stripped and a patterned sacrificial layer 65 is formed on the patterned metal layer 64 by, for example, an electrochemical deposition process, an electrochemical plating process or other suitable processes followed by a lapping or CMP process. The patterned sacrificial layer 65 is substantially coplanar with the patterned metal layer 64.

Figure 6D:
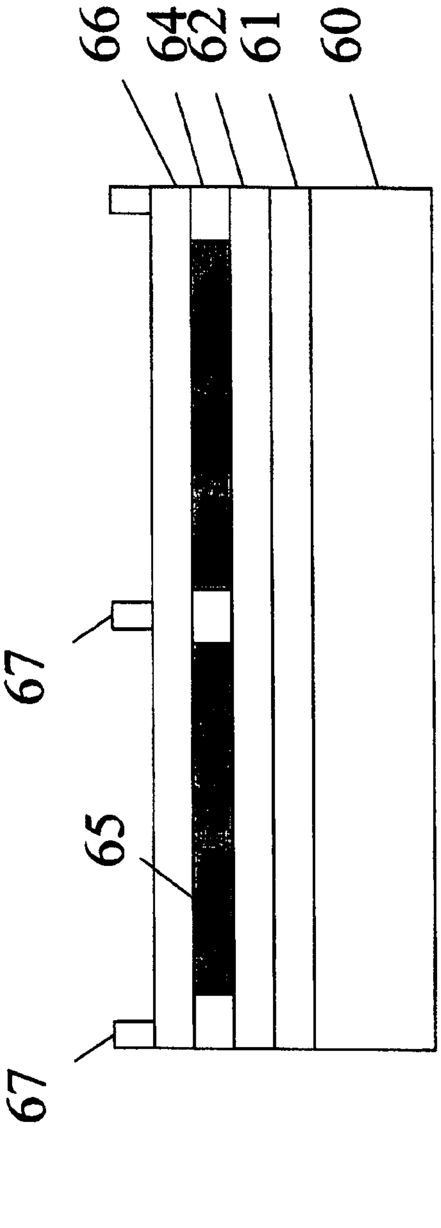

Referring to FIG. 6D, a conductive layer 66 is formed on the patterned metal layer 64 and the patterned sacrificial metal layer 65 by an electrochemical deposition process, an electrochemical plating process or other suitable processes. In one example, the seed layer 62, the patterned metal layer 64 and the conductive layer 66 include substantially the same material, which is selected from one of Ni, NiCo, NiFe and NiMn. Next, bumps 67 disposed above the patterned metal layer 64 are formed.

The structure illustrated in FIG. 6D is substantially the same as that illustrated in FIG. 5D. The steps required to form unsealed chambers, as those illustrated in FIG. 5F, or form sealed chambers, as those illustrated in FIG. 5G, are substantially the same as those illustrated through FIGS. 5E, 5F and 5G and therefore will not be repeated herein.

Figure 7:
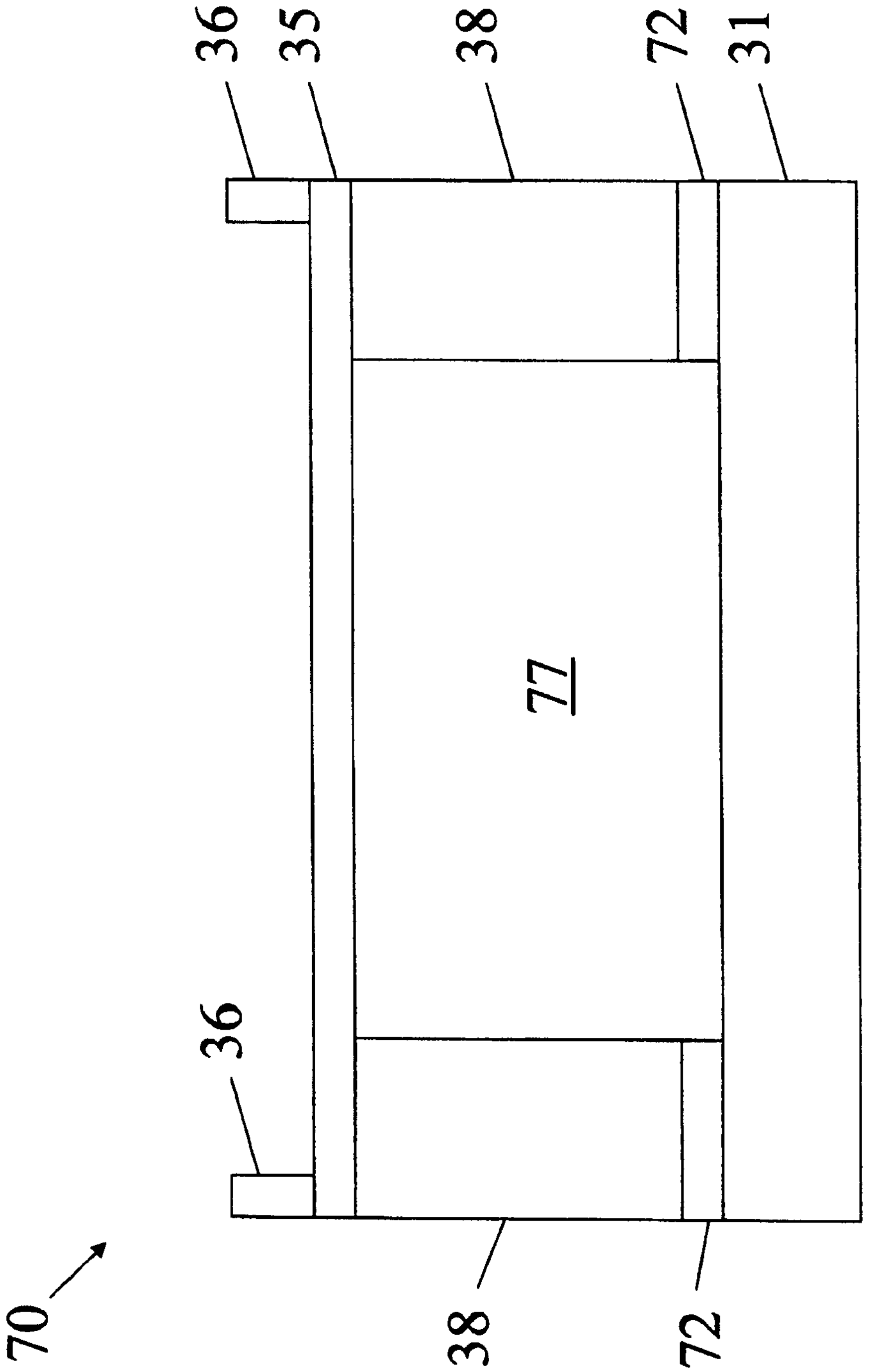
FIG. 7 is a schematic cross-sectional view of a capacitive ultrasonic transducer in accordance with another example of the present invention.

FIG. 7 is a schematic cross-sectional view of a capacitive ultrasonic transducer 70 in accordance with another example of the present invention. Referring to FIG. 7A, the capacitive ultrasonic transducer 70 includes a similar structure to the capacitive ultrasonic transducer 30 illustrated in FIG. 3A except a patterned insulating layer 72, which is formed between the support frame 38 and the substrate 31. A chamber 77, either sealed or unsealed, is defined by the substrate 31, the patterned insulating layer 72, the support frame 38 and the conductive layer 35.

Figure 8A:
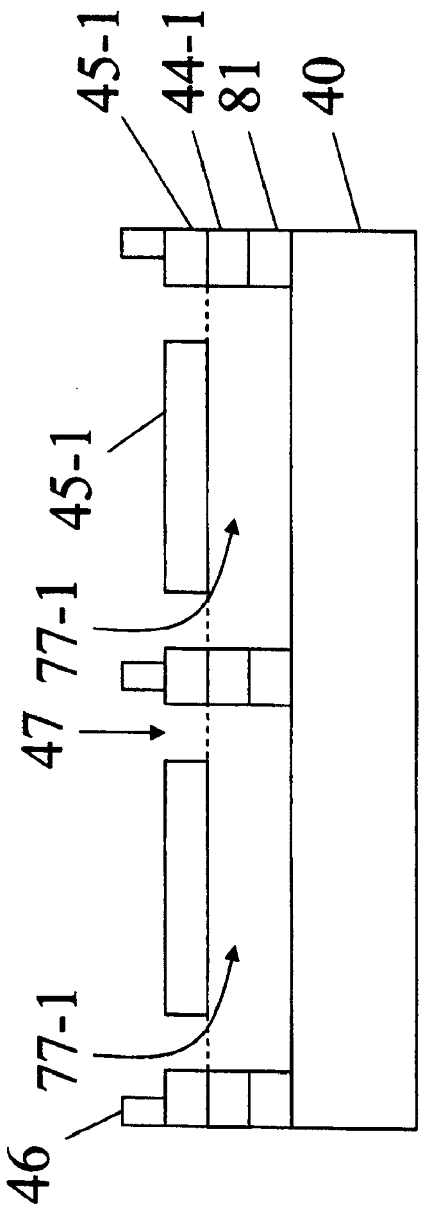
FIG. 8A is a schematic cross-sectional diagram illustrating a method for fabricating capacitive ultrasonic transducers in accordance with one example of the present invention.

FIG. 8A is a schematic cross-sectional diagram illustrating a method for fabricating capacitive ultrasonic transducers in accordance with one example of the present invention. Referring to FIG. 8A, also referring to FIG. 4F, after removing the sacrificial metal layer 43 (illustrated in FIG. 4E), portions of the insulating layer 41 (FIG. 4F) thus exposed are removed through the openings 47 by a conventional wet etch process or other suitable processes. The wet etch process is etch selective so that the exposed portions of the insulating layer 41 is removed without significantly removing the substrate 40, resulting in a patterned insulating layer 81 formed between the substrate 40 and the patterned metal layer 44-1, which subsequently becomes a support frame. Chambers 77-1 are therefore defined but not sealed by the substrate 40, the patterned insulating layer 81, the patterned metal layer 44-1 and the patterned conductive layer 45-1. The chambers 77-1 may be sealed by a similar process illustrated with respect to FIG. 4G. Each of the capacitive ultrasonic transducers being fabricated includes a resultant structure similar to that of the capacitive ultrasonic transducer 70 illustrated in FIG. 7.

Figure 8B:
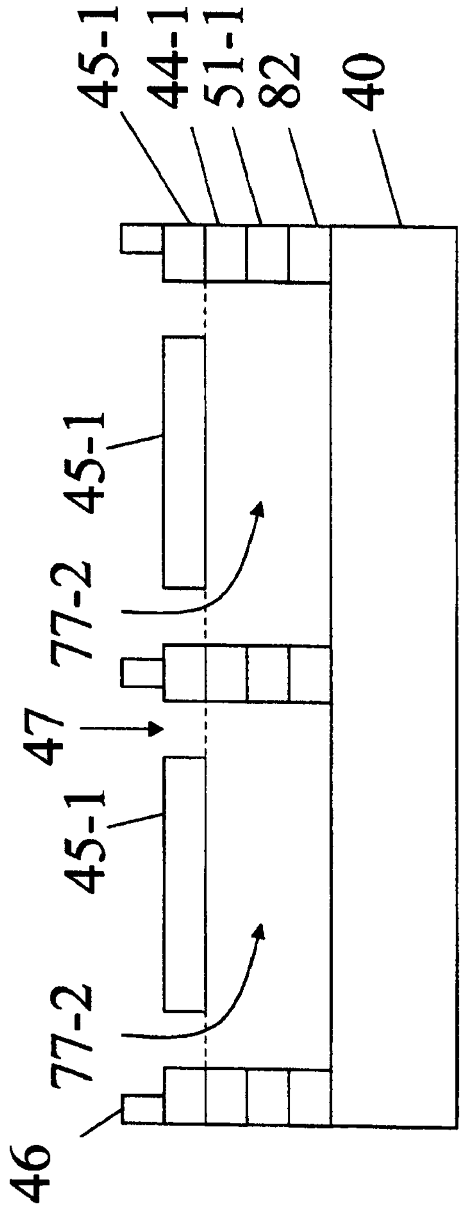
FIG. 8B is a schematic cross-sectional diagram illustrating a method for fabricating capacitive ultrasonic transducers in accordance with another example of the present invention.

FIG. 8B is a schematic cross-sectional diagram illustrating a method for fabricating capacitive ultrasonic transducers in accordance with another example of the present invention. Referring to FIG. 8B, also referring to FIG. 5F, after removing the sacrificial metal layer 43 (illustrated in FIG. 5E) and portions of the seed layer 51 (illustrated in FIG. 5E), portions of the insulating layer 41 (FIG. 5F) thus exposed are removed through the openings 47 by a conventional wet etch process or other suitable processes. A patterned insulating layer 82 is formed between the substrate 40 and the patterned metal seed layer 51-1, which subsequently becomes a support frame together with the patterned metal layer 44-1. Chambers 77-2 are therefore defined but not sealed by the substrate 40, the patterned insulating layer 82, the patterned seed layer 51-1, the patterned metal layer 44-1, and the patterned conductive layer 45-1. The chambers 77-2 may be sealed by a similar process illustrated with respect to FIG. 5G. Each of the capacitive ultrasonic transducers being fabricated includes a resultant structure similar to that of the capacitive ultrasonic transducer 70 illustrated in FIG. 7.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A method for fabricating capacitive ultrasonic transducers, comprising:

providing a substrate;

forming an insulating layer on the substrate;

forming a patterned first metal layer on the insulating layer;

forming a patterned second metal layer substantially coplanar with the patterned first metal layer;

forming a patterned third metal layer on the patterned first metal layer and the patterned second metal layer, exposing portions of the patterned first metal layer through openings; and removing the patterned first metal layer through the openings.

2. The method of claim 1, further comprising:

forming a patterned photoresist layer over the insulating layer; and forming a patterned first metal layer substantially coplanar with the patterned photoresist layer.

3. The method of claim 1, further comprising:

removing the patterned first metal layer through the openings, exposing portions of the insulating layer; and removing the portions of the insulating layer.

4. The method of claim 1, further comprising:

forming a metal layer on the patterned first metal layer and the patterned second metal layer;

forming a patterned fourth metal layer in the metal layer in location corresponding to the patterned second metal layer; and patterning and etching the metal layer to form the patterned third metal layer.

5. The method of claim 1, further comprising forming a patterned metal layer to fill the openings.

6. The method of claim 1, further comprising:

forming a fourth metal layer on the insulating layer; and forming the patterned photoresist layer on the fourth metal layer.

7. The method of claim 1, further comprising forming the patterned second metal layer and the patterned third metal layer with substantially the same material.

8. The method of claim 1, further comprising forming the patterned second metal layer, the patterned third metal layer and the fourth metal layer with substantially the same material.

9. A method for fabricating capacitive ultrasonic transducers, comprising:

providing a substrate;

forming an insulating layer on the substrate;

forming a metal layer on the insulating layer;

forming a patterned photoresist layer on the metal layer, exposing portions of the metal layer;

forming a patterned first metal layer substantially coplanar with the patterned photoresist layer;

removing the patterned photoresist layer;

forming a patterned second metal layer substantially coplanar with the patterned first metal layer;

forming a patterned third metal layer on the patterned first metal layer and the patterned second metal layer, exposing portions of the patterned first metal layer through openings; and removing the patterned first metal layer and portions of the metal layer through the openings.

10. The method of claim 9, further comprising:

forming a metal layer on the patterned first metal layer and the patterned second metal layer;

forming a patterned fourth metal layer in the metal layer in location corresponding to the patterned second metal layer; and patterning and etching the metal layer to form the patterned third metal layer.

11. The method of claim 10, further comprising forming the metal layer, the patterned second metal layer and the patterned third metal layer with substantially the same material.

12. The method of claim 9, further comprising forming a patterned metal layer to fill the openings.

13. The method of claim 9, further comprising forming the patterned second metal layer and the patterned third metal layer with substantially the same material.

14. The method of claim 9, further comprising forming a metal layer on the insulating layer with a material selected from one of Ti, Cu, Ni, NiCo, NiFe and NiMn.

15. The method of claim 9, further comprising:

removing the patterned first metal layer and portions of the metal layer through the openings, exposing portions of the insulating layer; and removing the portions of the insulating layer.

* * * * *

UNITED STATES PATENT AND TRADEMARK OFFICE

CERTIFICATE OF CORRECTION

PATENT NO. : 7,937,834 B2
APPLICATION NO. : 12/049224
DATED : May 10, 2011
INVENTOR(S) : Chang et al.

It is certified that error appears in the above-identified patent and that said Letters Patent is hereby corrected as shown below:

On the Title page,
Item “(57) Abstract
A capacitive ultrasonic transducer includes a first electrode, an insulating layer formed on the first electrode, at least one support frame formed on the insulating layer, and a second electrode formed space apart from the first electrode, wherein the first electrode and the second electrode define an effective area of oscillation of the capacitive ultrasonic transducer, and the respective length of the first electrode and the second electrode defining the effective area of oscillation is substantially the same.” should read
--(57) Abstract
A capacitive ultrasonic transducer includes a first electrode, an insulating layer formed on the first electrode, at least one support frame formed on the insulating layer, and a second electrode formed spaced apart from the first electrode, wherein the first electrode and the second electrode define an effective area of oscillation of the capacitive ultrasonic transducer, and the respective length of the first electrode and the second electrode defining the effective area of oscillation is substantially the same.--.

Column 6
Line 33, “sequentially” should read --sequently--.

Signed and Sealed this
Twenty-sixth Day of June, 2012

David J. Kappos
*Director of the United States Patent and Trademark Office*